United States Patent [19]
Mitsuda

[11] Patent Number: 5,670,867
[45] Date of Patent: Sep. 23, 1997

[54] CURRENT SENSING CIRCUIT

[75] Inventor: Tsuyoshi Mitsuda, Tokyo, Japan

[73] Assignee: NEC Corporation, Tokyo, Japan

[21] Appl. No.: 685,950

[22] Filed: Jul. 22, 1996

[30] Foreign Application Priority Data

Jul. 26, 1995 [JP] Japan .................. 7-190317

[51] Int. Cl.$^6$ .................. G05F 3/04; H02H 7/00
[52] U.S. Cl. .................. 323/312; 361/18
[58] Field of Search .................. 323/312, 316; 361/18

[56] References Cited

U.S. PATENT DOCUMENTS

| | | |
|---|---|---|
| 4,021,701 | 5/1977 | Davies .................. 361/18 |
| 4,355,341 | 10/1982 | Kaplan .................. 361/79 |
| 4,553,084 | 11/1985 | Wrathall . |
| 5,559,500 | 9/1996 | Kase .................. 323/315 |
| 5,587,655 | 12/1996 | Oyabe et al. .................. 323/312 |

Primary Examiner—Stuart N. Hecker
Attorney, Agent, or Firm—Whitham, Curtis, Whitham & McGinn

[57] ABSTRACT

A current sensing circuit has an output NMOS transistor, connected between an output node and a power supply terminal, for passing a load current of an output load, a pair of sensing NMOS and PMOS transistors connected, in series at a first node, between the output node and the power supply terminal, a control section for supplying a common gate voltage to the transistors, and a voltage detecting section for detecting the potential at the first node. When the output transistor and sensing NMOS transistor are on, the sensing PMOS transistor is off. Accordingly, substantially no current flows through the sensing transistors so that power consumption for sensing operation is reduced. The output transistor is a vertical MOSFET while the sensing transistors are a horizontal MOSFET integrated in a semiconductor circuit.

5 Claims, 3 Drawing Sheets

5,670,867

CURRENT SENSING CIRCUIT

BACKGROUND OF THE INVENTION (a) Field of the Invention

The present invention relates to a current sensing circuit and, more particularly, to a current sensing circuit for detecting an over-current flowing through an output transistor.

(b) Description of the Related Art

FIG. 1 shows an example of a conventional circuit disclosed in U.S. Pat. No. 4,553,084 issued on Nov. 12, 1985. A first vertical n-channel MOS (NMOS) transistor Q1 including a large number of cell transistors is connected between a power supply terminal T1 and an output load 11. A second vertical NMOS transistor Q2 having the same cell structure as those of the cell transistors of the first NMOS transistor Q1 is connected together with a serial sensing resistor between the power supply terminal T1 and the output load 11. The gates of first and second NMOS transistors Q1 and Q2 are controlled by a common control voltage Vc supplied from a control section 12. A comparator 13 is provided for detecting the potential at a node N2 connecting sensing resistor R1 and transistor Q2 with respect to a reference voltage $V_{R1}$ to output an over-current signal.

By the configuration as described above, when both NMOS transistors Q1 and Q2 are on, the ratio between the currents flowing through NMOS transistors Q1 and Q2 is equal to the ratio between the numbers of cell transistors in both the NMOS transistors Q1 and Q2. For example, when the ratio between the numbers of cell transistors in NMOS transistors Q1 and Q2 is A:1 wherein A is well larger than 1, the current flowing through first NMOS transistor Q1 is A times the current flowing through second NMOS transistor Q2. In the following description, first NMOS transistor 15 will be referred to as "output transistor", while second NMOS transistor Q2 will be referred to as "sensing transistor".

The current flowing through output load 11 flows through both output transistor Q1 and sensing transistor Q2 at the ratio A:1. A voltage drop $V_3$ appearing across sensing resistor R1 due to shunt current $I_2$ flowing through sensing transistor Q2 is proportional to the main current $I_1$ flowing through output transistor Q1. Thus, voltage drop $V_3$ can be expressed as follows:

$$V_3 = I_2 \times R1 = (I_1/A) \times R1.$$

Over-current flowing through the output transistor Q1 is detected by comparing voltage drop $V_3$ with a reference voltage $V_{R3}$. In a normal state, voltage drop $V_3$ is smaller than reference voltage $V_{R3}$, and when an over-current flows through output transistor Q1, voltage drop $V_3$ exceeds reference voltage $V_{R1}$. Thus, the sensed current $I_S$ can be expressed by the following equation:

$$I_s = (V_{R1}/R_S) \times A.$$

The accuracy of the conventional current sensing circuit 10 depend on the accuracy of the ratio of the currents flowing through the output transistor Q1 to the sensing transistor Q2 and the accuracy of the resistance of sensing resistor R1, both of which are generally not always satisfactory. The conventional current sensing circuit 10 also has a problem in that the sensing accuracy is low when output transistor Q1 and sensing transistor Q2 have different cell structures.

Moreover, since sensing transistor Q2 is in an on-state to pass sensing current whenever output transistor Q1 is in an on-state, the power consumption is considerably large in the current sensing circuit.

SUMMARY OF THE INVENTION

In view of the foregoing, it is an object of the present invention to provide a current sensing circuit which operates with an improved accuracy while having a reduced power consumption.

According to the present invention, there is provided a current sensing circuit for an output circuit in which a first transistor is connected between an output node and a power supply terminal. The current sensing circuit has a serial branch including a second and a third transistors and a comparator. The serial branch including the second and third transistors is connected between the output node and the power supply terminal in parallel to the first transistor. The second transistor is controlled such that the first and second transistors are on and off simultaneously. The third transistor is controlled such that it is turned on or off when the first and second MOS transistors are turned off or on. The comparator compares the potential at a node connecting the second and third transistors with a reference voltage to detect which is larger.

In the current sensing circuit of the present invention, since the accuracy of the sensed current varies depending substantially only on the accuracy of the on-resistance of the output transistor, the sensing accuracy is improved. In particular, the sensing accuracy is not affected by the structural design of the transistors device such as the number of cells in the transistors or the cell structure of the transistors. Accordingly, an accurate sensed current can be easily obtained in the present invenion. Moreover, since the second and third transistors are controlled in a complementary manner, the power consumption is reduced during the sensing operation.

The above and other objects as well as advantages of the present invention will become more clear by the following description of the preferred embodiments of the present invention with reference to the accompanying drawings.

DESCRIPTION OF THE PREFERRED EMBODIMENTS

Figure 1:
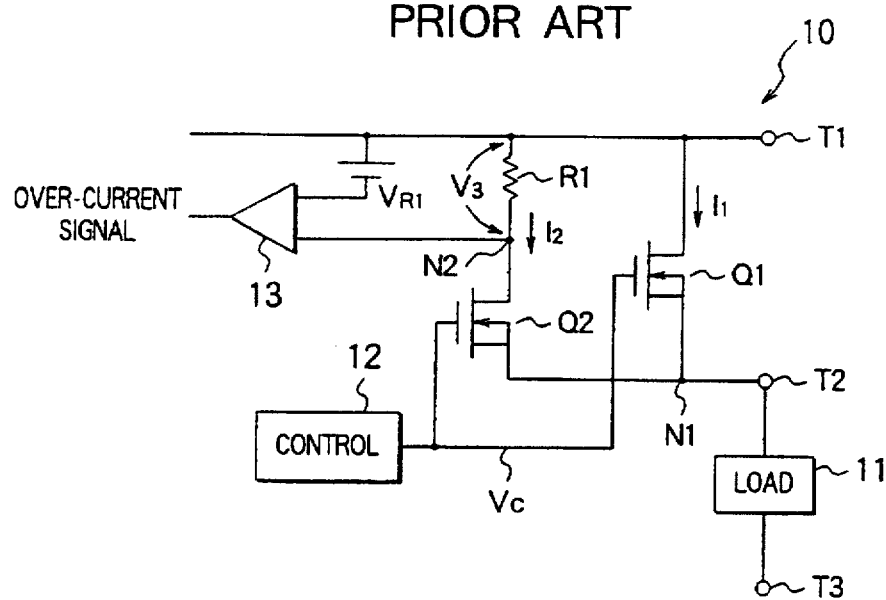
FIG. 1 is a circuit diagram of a conventional current sensing circuit.

Preferred embodiments of the present invention will now be described in more detail with reference to the accompanying drawings. It is to be noted that like constituent elements are designated by like reference numerals or characters throughout the drawings for the sake of understanding.

Figure 2:
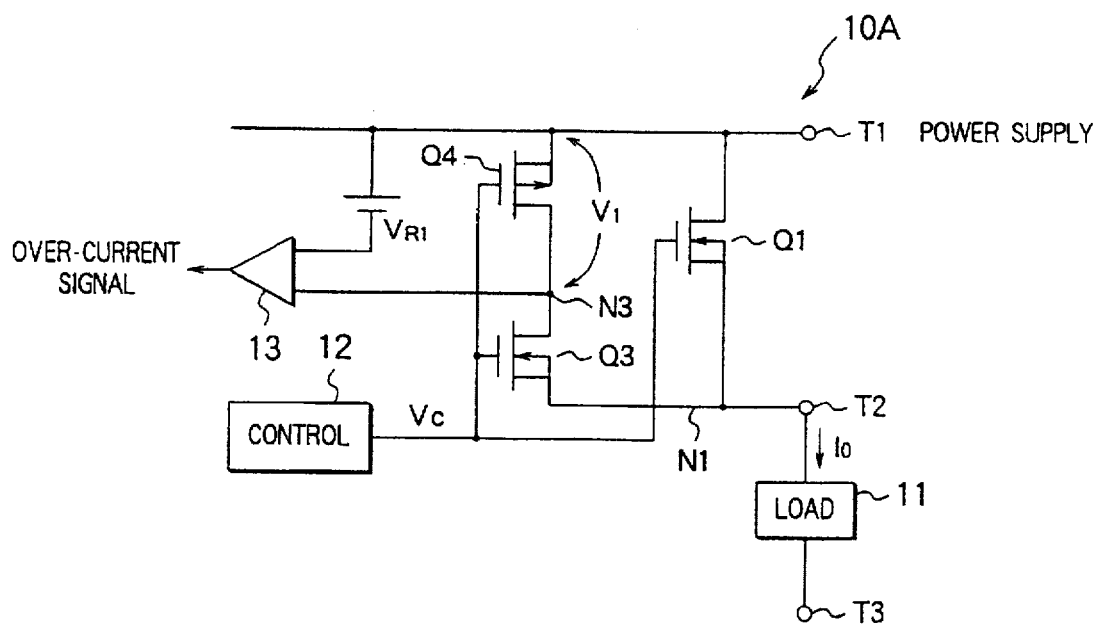
FIG. 2 is a circuit diagram of a current sensing circuit according to a first embodiment of the present invention.

Referring to FIG. 2 showing a current sensing circuit, generally designated at 10A, according to a first embodiment of the present invention, an output NMOS transistor Q1 is connected between a higher voltage power supply terminal T1 and an output node N1 connected to an output terminal T2 of the sensing circuit 10A. An output load 11 is connected between output terminal T2 and a lower voltage power supply terminal T3. A sensing NMOS transistor Q3 and a sensing PMOS transistor Q4 are connected in a complementary configuration between power supply terminal T1 and output node N1 in parallel to output NMOS transistor Q1. The gates of MOS transistors Q1, Q3 and Q4 are supplied with a common control voltage Vc from a control section 12. A comparator 13 is provided for comparing the potential at a node N3, connecting both the transistors Q3 and Q4 together, with a reference voltage $V_{R1}$ to output an over-current signal when the potential at node N3 exceeds reference voltage $V_{R1}$.

It is sufficient in the present embodiment that transistors Q1 and Q3 have the same gate voltage and transistors Q3 and Q4 are complementary to each other in order to obtain an accurate value for the sensed current. This reduces the restrictions on the structure of each transistor, thereby enhancing the design choice for the semiconductor circuit. For example, if output transistor Q1 is a vertical MOSFET, it is unnecessary to form transistors Q3 and Q4 as vertical transistors. When horizontal MOSFETs are employed for transistors Q3 and Q4, an advantage is obtained that the horizontal MOSFETs can be integrated with the vertical MOSFET. Namely, transistors Q3 and Q4 can be formed in a region adjacent to the region where transistor Q1 is formed.

In operation of the current sensing circuit 10A, if output transistor Q1 is on, then transistor Q3 is on while transistor Q4 is off, so that the potential at node N3 is equal to the potential at output node N1. Accordingly, potential difference $V_1$ between power supply terminal T1 and node N3 is equal to the on-voltage $V_{ds}$ appearing across output transistor Q1. Namely, the following relationship holds:

$$V_1 = V_{DS}.$$

Potential difference $V_1$ can be also expressed as follows:

$$V_1 = V_{DS} = R_{ON} \times I_O$$

where $R_{ON}$ is the on-resistance of output transistor Q1, and $I_O$ is the current flowing through the output load 11. When potential difference $V_1$ which is proportional to the output current $I_O$ exceeds a reference voltage $V_{R1}$, comparator 13 outputs a over-current signal indicating that an over-current is flowing through output transistor Q1.

The sensed current $I_S$, which can be detected in the current sensing circuit 10A, is presented by the following equation:

$$I_S = V_{R1}/R_{ON}.$$

By feeding the over-current signal of comparator 13 back to the control section 12 so as to lower the gate voltages for output transistor Q1 and sensing transistors Q3 and Q4, output transistor Q1 can be protected from an over-current damage.

On the other hand, if output transistor Q1 is off, then transistor Q3 is off while transistor Q4 is on, so that potential difference $V_1$ is substantially zero. In this state, voltage difference $V_1$ is well smaller than reference voltage $V_{R1}$, so that an erroneous over-current state will not be detected in comparator 13 during an off-state of output transistor Q1.

Another current sensing circuit, generally designated at 10B in FIG. 3, according to a second embodiment of the present invention will be described with reference to FIGS. 3–5. In these drawings, NMOS transistors Q1, Q3 and Q5 are shown as provided on a common semiconductor substrate. However, as may be apparent from these drawings, MOS transistors Q3 and Q5 can be provided as external components outside the semiconductor device including output transistor Q1. In the present embodiment, a current sensing operation can be performed at a constant accuracy regardless of the number of cell transistors of output transistor Q1.

Figure 3:
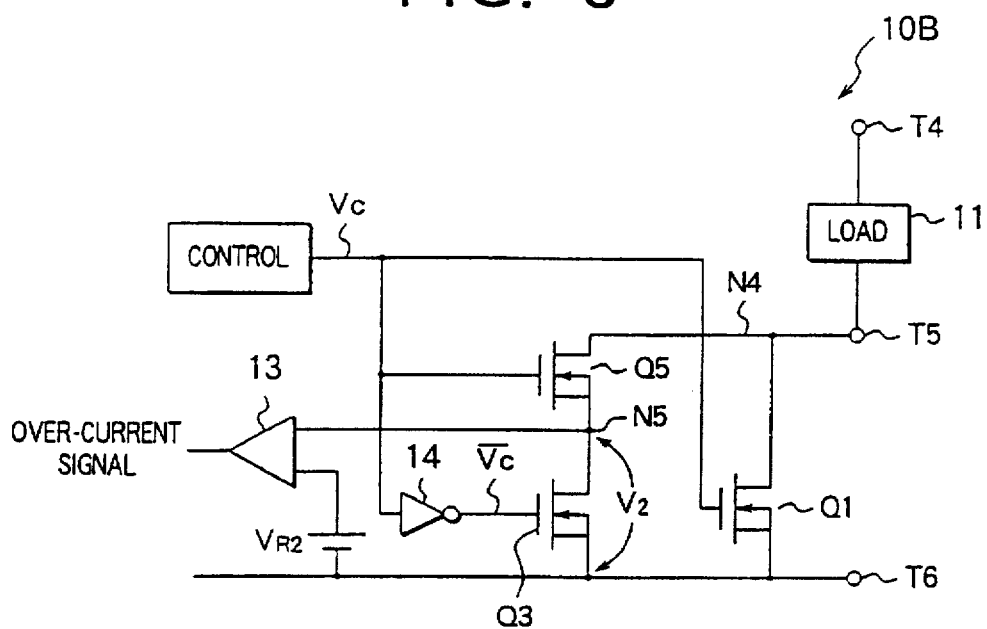
FIG. 3 is a circuit diagram of a current sensing circuit according to a second embodiment of the present invention.

In FIG. 3, an output NMOS transistor Q1 is connected between a lower voltage power supply terminal T6 and an output node N4 connected to an output terminal T5 of the sensing circuit 10B. NMOS sensing transistors Q3 and Q5 are connected in series at node N5 and between power supply terminal T6 and output node N4. An output load 11 is connected between a high voltage power supply terminal T4 and output terminal T5. The gates of output transistor Q1 and transistor Q5 are supplied with a common control voltage Vc supplied from a control section 12 while the gate of transistor Q3 is supplied with control voltage Vc from an inverter 14 having an input connected to the output of control section 12.

Figure 4:
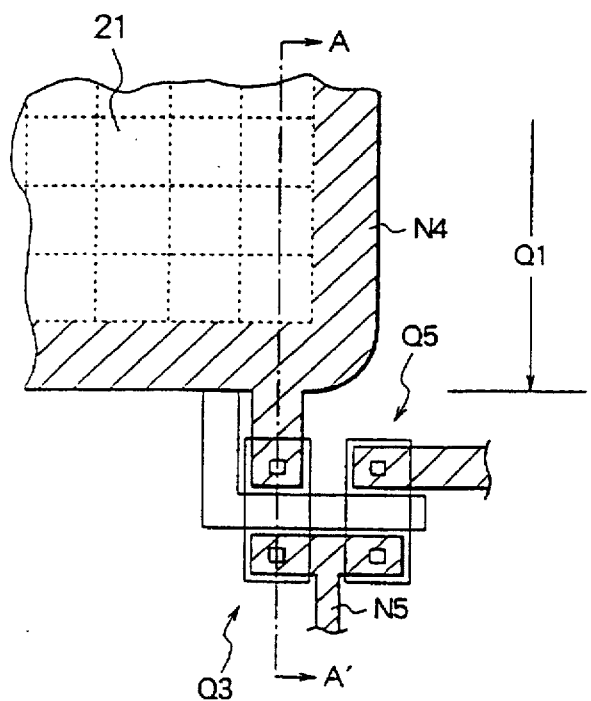
FIG. 4 is a partial plan view of the current sensing circuit of FIG. 3.
Figure 5:
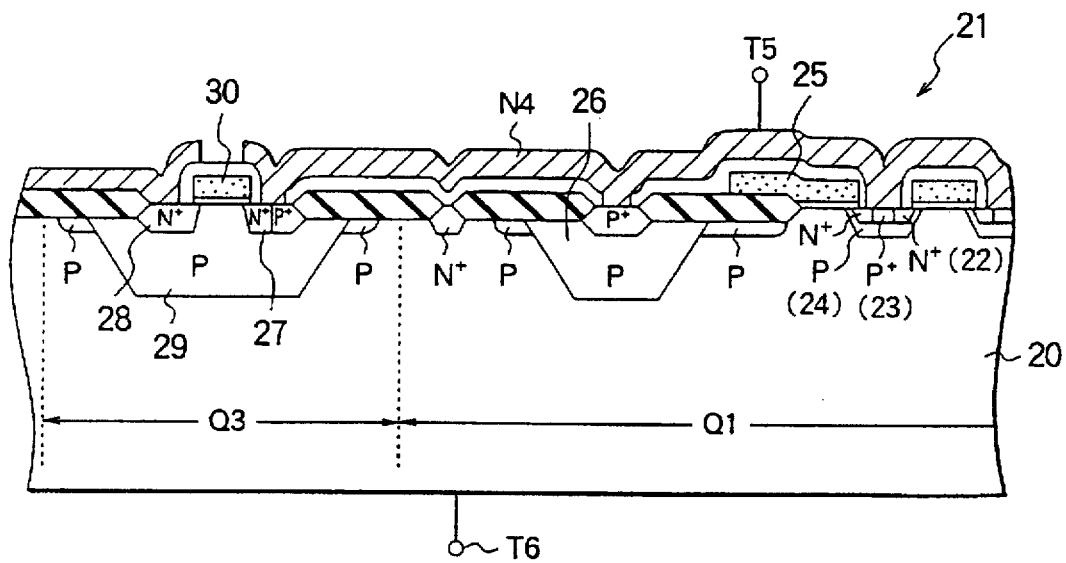
FIG. 5 is a sectional view taken along line A–A' in FIG. 4.

In FIGS. 4 and 5, output NMOS transistor Q1 formed as a vertical MOS transistor and sensing MOS transistors Q3 and Q5 formed as horizontal MOS transistors are integrated on a common semiconductor substrate. Output MOS transistor Q1 is formed of a large number of vertical cell transistors 21 arrayed in a matrix. Each of cell transistors 21 includes a $N^+$- source region 22 connected to output terminal T5 through $P^+$- region 23 and aluminium (Al) interconnection constituting output node N4, P-region 24 constituting a channel area, N– drain region 20 connected to power supply terminal T6 at the back surface of the substrate 20, and a gate 25 formed of polycrystalline silicon connected to the output Vc of the control section 12. Output transistor Q1 is encircled for separation by a guard ring 26 formed by P-region connected to output node N4. Sensing transistor Q3 includes $n^+$- source region 27 connected to output node N4, $N^+$- drain region 28 connected to node N5 both formed in a P-well region 29 formed in the N-substrate 20. Sensing transistor Q5 has a structure similar to that of sensing transistor Q3.

In operation, if output transistor Q1 is on, then transistor Q5 is on while transistor Q3 is off, so that the on-voltage $V_{DS}$ of output MOS transistor 1 is equal to potential difference $V_2$ between power supply terminal T6 and node N5, similarly to the case in the first embodiment. Comparator 13 compares potential difference $V_2$ with a reference voltage $V_{R2}$ so as to output an over-current signal when potential difference $V_2$ exceeds $V_{R2}$.

On the other hand, if output transistor Q1 is off, then transistor Q3 is on while transistor Q5 is off, so that potential difference $V_2$ is zero, similarly to the case in the first embodiment. This prevents erroneous over-current state from being detected during an off-state of output transistor Q1.

In the second embodiment, there is an additional advantage that all transistors can be formed as NMOS transistors so that the process for the manufacture of the sensing circuit can be simplified.

Figure 6:
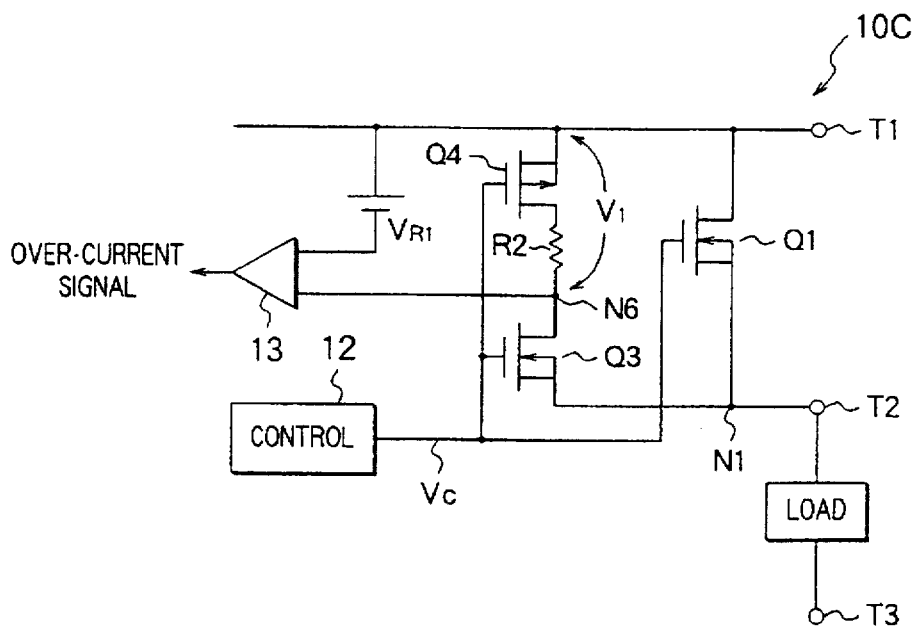
FIG. 6 is a circuit diagram of a current sensing circuit according to a third embodiment of the present invention.

Another current sensing circuit, generally designated at 10C, according to a third embodiment of the present invention will be described with reference to FIG. 6. This embodiment is similar to the first embodiment except that a resistor R2 is inserted between MOS transistors Q3 and Q4 of the first embodiment so as to suppress a penetrating current flowing through both transistors Q3 and Q4 during a transient state thereof. This prevents destruction of transistors Q3 and Q4 or deterioration of the performance of transistors Q3 and Q4. As mentioned, since the current sensing operation is performed only when transistor Q1 is on and transistor Q4 is off, substantially no current flows through transistor Q3 during detection. Accordingly, the introduction of resistor R2 does not affect the accuracy of the sensed current.

Since above embodiments are described only for examples, the present invention is not limited to such embodiments and it will be obvious for those skilled in the art that various modifications or alterations can be easily made based on the above embodiments within the scope of the present invention.

What is claimed is:

1. A current sensing circuit coupled between a load having a load current passing therethrough and a power supply terminal, comprising:

a first transistor coupled between an output terminal and said power supply terminal for passing said load current;

a second and a third transistors connected, in series at a first node between said output terminal and said power supply terminal, a control section for supplying a first control signal to turn on said first and second transistors while supplying a second control signal to turn off said third transistor during a sensing operation; and a voltage detection section for detecting a voltage at said first node.

2. The current sensing circuit as defined in claim 1 wherein said first and second transistors are NMOS transistors and said third transistor is PMOS transistor, and wherein said second control signal is substantially equal to said first control signal.

3. The current sensing circuit as defined in claim 1 wherein said first through third transistors are NMOS transistors and wherein said second control signal is opposite in polarity to said first control signal.

4. The current sensing circuit as defined in claim 1 wherein said first transistor is a vertical MOS transistor and said second and third transistors are horizontal MOS transistors.

5. The current sensing circuit as defined in claim 1 further comprising a resistor inserted between said first node and said third transistor.

* * * * *